United States Patent [19]
Yoshida et al.

[11] Patent Number: 5,854,577
[45] Date of Patent: Dec. 29, 1998

[54] VARIABLE FREQUENCY JFET MICROWAVE OSCILLATOR WITH VARIABLE IMPEDANCE BIAS

[75] Inventors: Sadayoshi Yoshida; Kazunari Sato, both of Tokyo, Japan

[73] Assignee: NEC Corporation, Tokyo, Japan

[21] Appl. No.: 846,376

[22] Filed: Apr. 30, 1997

[30] Foreign Application Priority Data

Feb. 16, 1996 [JP] Japan .................................. 8-029261

[51] Int. Cl.⁶ ........................................................ H03B 5/18
[52] U.S. Cl. ........................ 331/117 D; 331/34; 331/96; 331/177 R
[58] Field of Search .................................. 331/34, 36 R, 331/36 C, 96, 117 R, 117 FE, 117 D, 177 R, 177 V, 179

[56] References Cited

U.S. PATENT DOCUMENTS 4,216,443  8/1980  Zaderej ........................... 331/117 FE X
5,097,228  3/1992  McJunkin ........................... 331/185 X

FOREIGN PATENT DOCUMENTS 6-334438  12/1994  Japan .

*Primary Examiner*—David Mis

[57] ABSTRACT

A variable frequency microwave oscillator comprises an oscillation FET of a junction type, a fixed impedance block connected to the source of the oscillation FET for determining the drain impedance on the source of the oscillation FET, and a variable bias block including inductance connected to the drain of the oscillation FET and an impedance controlling junction FET both for determining the drain impedance of the oscillation FET of a junction type. The gate of the oscillation FET is connected to an external resonance block which generates an oscillation in association with the negative impedance appearing on the gate of the oscillation FET. The oscillation frequency is controlled by a control voltage applied to the gate of the impedance controlling FET.

6 Claims, 3 Drawing Sheets

VARIABLE FREQUENCY JFET MICROWAVE OSCILLATOR WITH VARIABLE IMPEDANCE BIAS

BACKGROUND OF THE INVENTION

(a) Field of the Invention

The present invention relates to a variable frequency microwave oscillator and, more particularly, to a microwave oscillator capable of outputting a variable frequency and having a junction type field effect transistor (referred to as simply FET hereinafter).

(b) Description of the Related Art

A microwave oscillator capable of outputting a variable frequency is generally used in a mobile communication system, for example. FIG. 1 shows an example of conventional microwave oscillators described in Patent Publication No. JP-A-1994-334438. The microwave oscillator generally designated at 10 comprises an oscillation FET 20 having a gate electrode 21 connected to a matching circuit or external resonance circuit RQ, a source electrode 22 connected to a variable impedance block VP including a first branch of inductance 19 and a second branch including Schottky diode D1 and capacitor C5 connected in series, and a drain electrode 23 connected to a bias block BC including bias resistor 18 and inductance 17 connected in series and bypass capacitor C3.

The impedance appearing on the source electrode 22 is substantially determined by the second branch of the variable impedance block VP in a high frequency range because inductance 19 can be regarded as open in the high frequency range. Specifically, the impedance appearing on the source electrode 22 is substantially determined by the capacitive impedance of the Schottky diode D1 and the capacitance of the capacitor C5, the former being controlled by a control voltage supplied though control terminal 13 for the Schottky diode D1. The impedance on the source electrode 22 which is initially capacitive in the high frequency range becomes more capacitive by increasing the control voltage in a positive direction. The impedance appearing on the drain electrode 23 is substantially determined by inductance 17.

The impedance appearing on the gate electrode 21 of the oscillation FET 20 is determined by both the impedances appearing on the source electrode 22 and drain electrode 23 and exhibits a negative impedance in the high frequency range. The negative impedance in association with the external resonance block RQ provide an oscillation having a resonance frequency determined by the negative impedance and the external resonance block RQ, the oscillation being supplied through the output terminal 12. The negative impedance is varied depending on the capacitive impedance on the source electrode 22, which is varied by the control voltage supplied through the control terminal 13. Thus, the control voltage determines the oscillation frequency of the microwave oscillator 10 of FIG. 1.

The conventional microwave oscillator has a drawback in that current flows out through the control terminal 13 to thereby increase power consumption during operation thereof because the control terminal 13 is connected to the cathode of the Schottky diode D1, which is accordingly connected in a forward direction between the power supply terminal 11 and control terminal 13 to provide a forward current through the control terminal 13.

SUMMARY OF THE INVENTION

In view of the forgoing, it is an object of the present invention to provide a microwave oscillator capable of outputting a variable frequency with a reduced power consumption.

The present invention provides a variable frequency microwave oscillator comprising a first junction field effect transistor (FET) having a gate, source and a drain, an impedance block connected to the source of the first FET to determine a source impedance appearing on the source of the first FET, and a variable bias block having a control terminal for receiving a control voltage and connected to the drain of the first FET to determine a drain impedance appearing on the drain of the first FET at a value based on the control voltage, whereby the gate of the first FET exhibits in a certain frequency range a negative impedance for oscillation which is determined by the source impedance and drain impedance.

In accordance with the present invention, since the current flowing through the control terminal is substantially eliminated, power consumption of the microwave oscillator can be reduced.

The above and other objects, features and advantages of the present invention will be more apparent from the following description, referring to the accompanying drawings.

DESCRIPTION OF THE PREFERRED EMBODIMENTS

Figure 1:
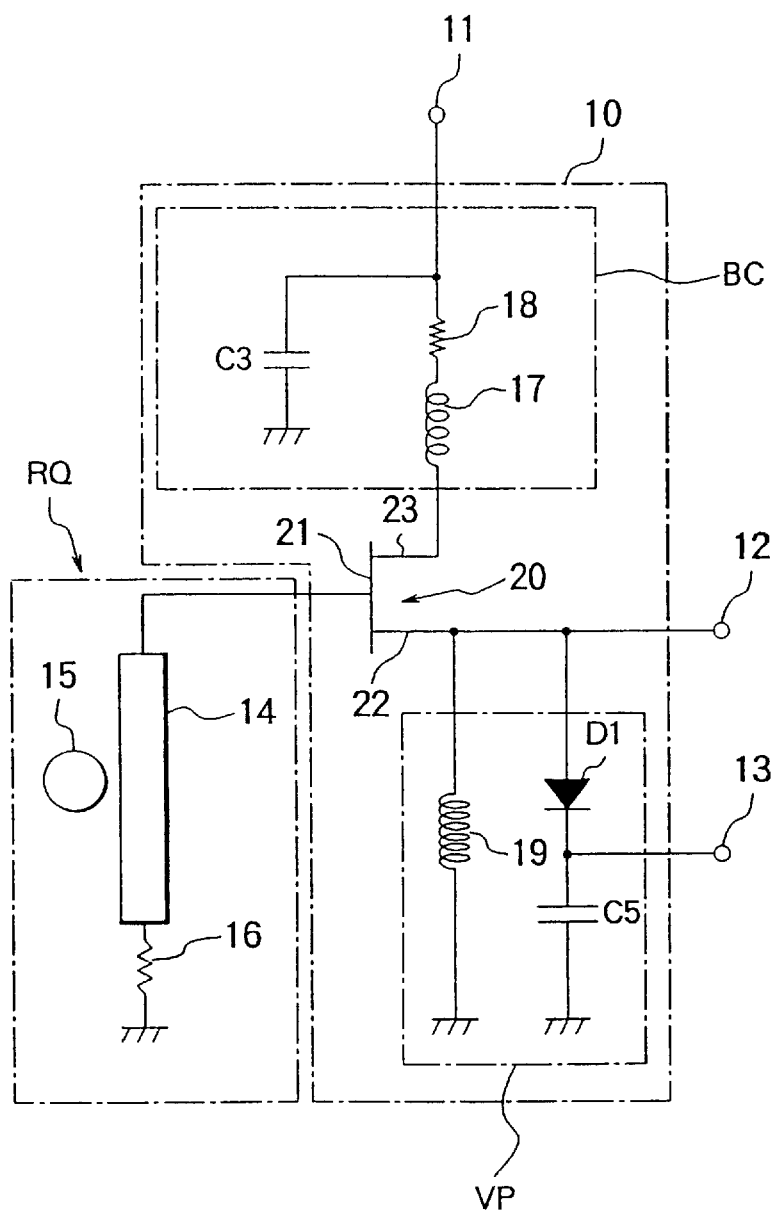
FIG. 1 is a circuit diagram of a conventional variable frequency microwave oscillator.

Now, the present invention will be more specifically described based on the preferred embodiments thereof with reference to the accompanying drawings, wherein similar constituent elements are designated by the same or similar reference numerals or characters.

Figure 2:
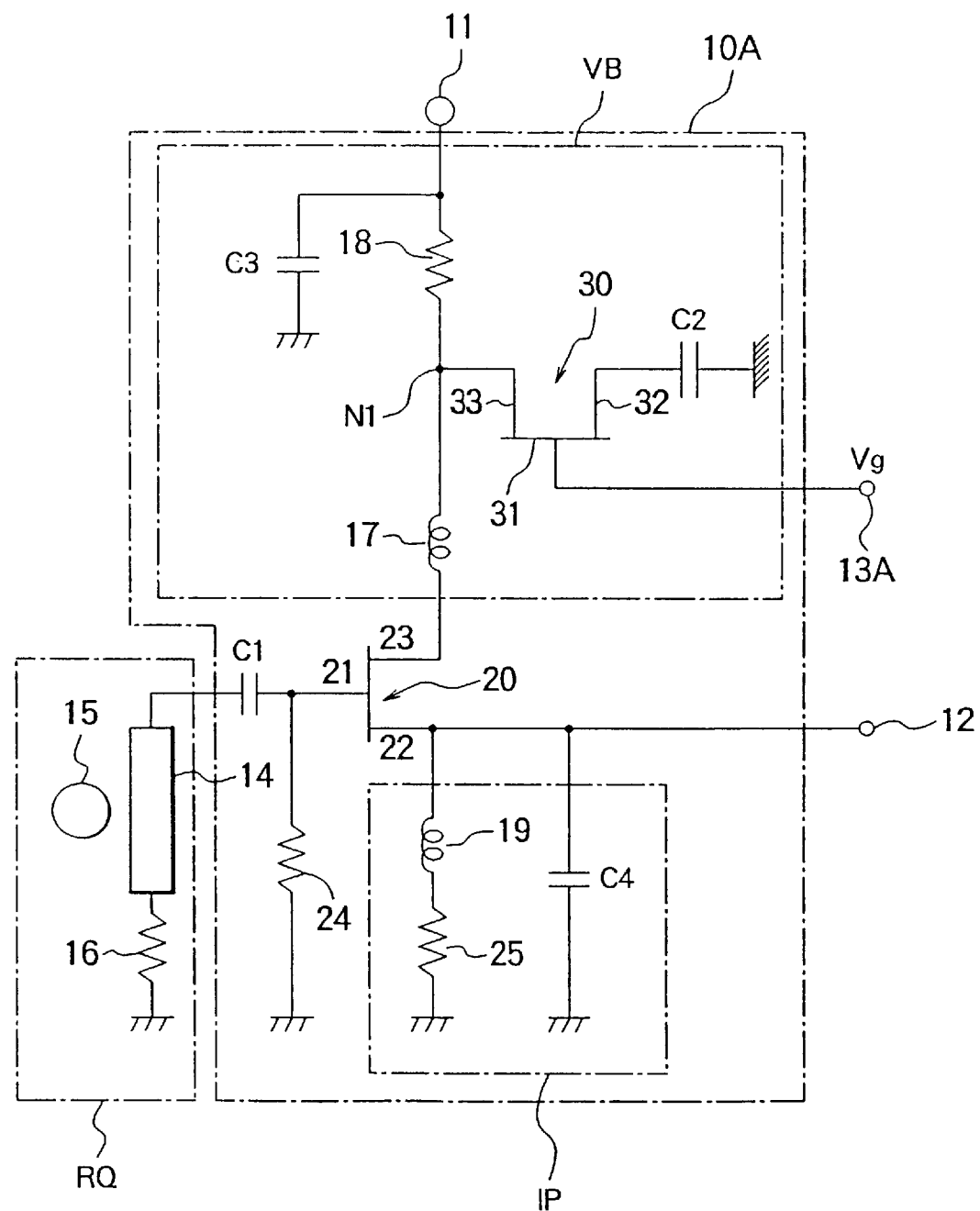
FIG. 2 is a circuit diagram of a variable frequency microwave oscillator according to a first embodiment of the present invention.

FIG. 2 shows a variable frequency microwave oscillator according to a first embodiment of the present invention. The microwave oscillator generally designated at 10A includes an oscillation FET 20, a fixed impedance block IP, and a variable bias block VB including an impedance controlling FET 30. The microwave oscillator 10A oscillates in associated with an external resonance block or matching circuit RQ including a strip line 14 and a dielectric resonator 15 coupled with the strip line 14 for a resonance function. An end of the strip line 14 is connected to the ground through a terminating resistor 16.

Each of the oscillation FET 20 and impedance controlling FET 30 is implemented by a junction FET such as a MESFET (metal-semiconductor FET). However, the impedance controlling FET 30 need not be a junction FET and may be a MOSFET.

The variable bias block VB includes resistor 18 and inductance 17 connected in series at node N1, which is connected to the drain electrode 33 of the impedance controlling FET 30 in the variable bias block VB. The impedance controlling FET 30 has a source 32 connected to the ground through capacitor C2 for cutting off a direct current component and a gate electrode 31 connected to a control terminal 13A. One of the terminals of resistor 18 other than node N1 is connected to a power supply terminal 11 directly and to the ground through bypass capacitor C3.

The gate electrode 21 of the oscillation FET 20 is connected to the other end of the strip line 14 in the external resonance block RQ through a coupling capacitor C1 and to the ground through resistor 24. The source electrode 22 of the oscillation FET 20 is connected to the fixed impedance block IP having a first branch including self bias resistor 25 and inductance 19 connected in series with each other and a second branch including capacitor C4. The drain electrode 23 of the oscillation FET 20 is connected to inductance 17 in the variable bias block VB. The variable bias block VB has a function to vary the negative impedance appearing on the gate electrode 21 of the oscillation FET 20 to vary the oscillation frequency depending on a control voltage supplied through the control terminal 13A.

The control voltage Vg applied to the gate electrode 31 of the impedance controlling FET 30 through the control terminal 13A is varied between 0 volt and the pinch-off voltage or threshold voltage Vth of the impedance controlling FET 30. For the control voltage Vg=0, the impedance controlling FET 30 in association with inductance 17 generates a negative impedance appearing on the drain electrode 23 of the oscillation FET 20 in the frequency range determined by the drain electrode 23 of the oscillation FET 20.

When the control voltage Vg is gradually varied from 0 volt toward the pinch-off voltage in a negative voltage range, the impedance controlling FET 30 exhibits a capacitive property in the high frequency range to vary the capacitance of the drain electrode 31 of the impedance controlling FET 30, which in turn varies the impedance appearing on the drain electrode 23 of the oscillation FET 20. When the control voltage Vg reaches around the pinch-off voltage, the impedance controlling FET 30 is pinched-off and stays in an off-state.

In operation, the impedance appearing on the source electrode 22 of the oscillation FET 20 is determined by the impedance on the output terminal 12 and the capacitance of capacitor C4 due to the higher impedance of inductance 19 in the high frequency range. The impedance appearing on the drain electrode 23 of the oscillation FET 20 is variable in accordance with the impedance appearing on the drain electrode 33 of the impedance controlling FET 30 and controlled by the control voltage Vg. That is, the impedance on the drain electrode 23 of the oscillation FET 20 can be controlled.

The negative impedance appearing on the gate electrode 21 of the oscillation FET 20 in the high frequency range is generally determined by the impedances on the drain electrode 23 and source electrode 22 of the oscillation FET 20.

In the high frequency range, wherein the negative impedance appears on the gate electrode 21, the oscillation FET 20 first oscillates at the resonance frequency of the external resonance block RQ, which is determined by the strip line 14 and dielectric resonator 15. The negative impedance appearing on the gate electrode of the oscillation FET 20 is varied in accordance with the bias voltage for the impedance controlling FET 30 to vary the oscillation frequency of the oscillation FET 20 in the microwave oscillator. In the present embodiment, since the oscillation frequency can be varied without a change in the drain potential of the oscillation FET 20, a stable characteristic of the oscillator can be obtained independently of the control voltage.

Figure 3:
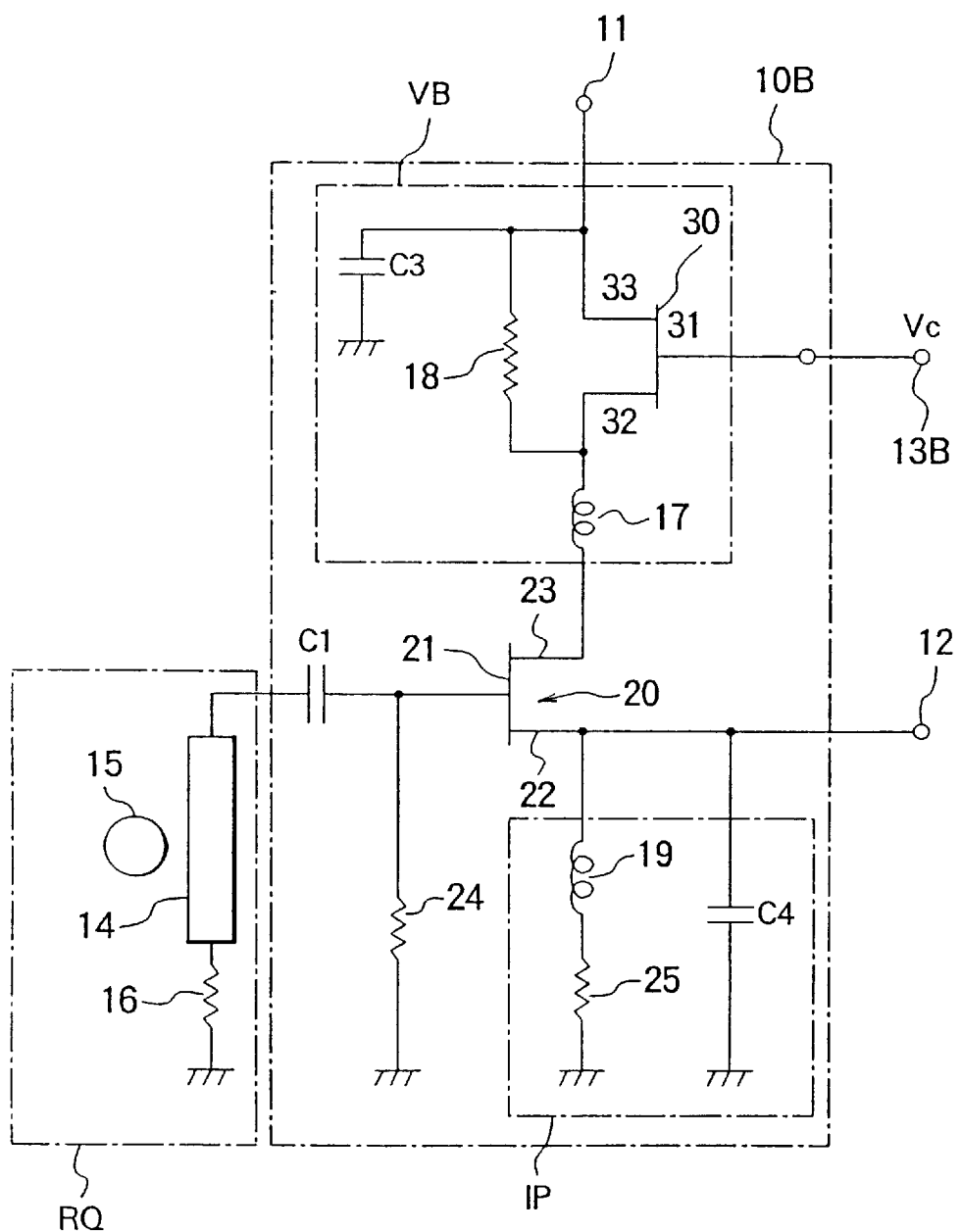
FIG. 3 is a circuit diagram of a variable frequency microwave oscillator according to a second embodiment of the present invention.

FIG. 3 shows a microwave oscillator 10B according to a second embodiment of the present invention. In the present embodiment, a variable bias voltage is supplied for the drain electrode 23 of the oscillation FET 20 by the impedance controlling FET 30 in the variable bias block VB. Specifically, the impedance controlling FET 30 is connected in series with the oscillation FET 20 and in parallel with bias resistor 18.

In operation, the impedance appearing on the source electrode 22 of the oscillation FET 20 is substantially determined by the impedance on the output terminal 12 and the capacitance of capacitor C4, similarly to the first embodiment. The impedance appearing on the drain electrode 23 of the oscillation FET 20 is determined by inductance 17, bias resistor 13 and the impedance of the impedance controlling FET 30.

The control voltage Vc applied through the control terminal 13B to the gate of the impedance controlling FET 30 is varied from, for example, the threshold voltage Vt of the impedance controlling FET 30 to 0 volt. For the control voltage Vc=Vt, since the impedance controlling FET 30 stays in an off-state, the oscillation FET 20 oscillates at a frequency determined by inductance 17 and bias resistor 18. For the control voltage Vc wherein Vt<Vc<0, when the control voltage Vc shifts toward 0 volt, the impedance on the drain electrode 23 of the oscillation FET 20 becomes more inductive, because the parasitic capacitance of the impedance controlling FET 30 is reduced with the impedance of inductance 17 being unchanged. In addition, since the voltage drop across the impedance controlling FET 30 is reduced in this state, the voltage applied across the drain electrode 23 and source electrode 22 of the oscillation FET 20 is increased to thereby reduce the impedance of the oscillation FET 20.

Accordingly, the negative impedance appearing on the gate electrode of the oscillation FET 20 changes to thereby change the resonance frequency which is initially determined by the dielectric resonator 15 and the strip line 14 of the external resonance block RQ. For the control voltage Vc=0, the impedance of the impedance controlling FET 20 is significantly reduced to provide a situation that the impedance in the variable bias block VB is substantially determined by inductance 17. Accordingly, in the operational range of the oscillator, i.e., for the control voltage 0>Vc>Vt, the parallel impedance of the impedance controlling FET 30 and bias resistor 18 is determined at a suitable value by the control voltage to provide suitable drain potential and drain impedance to the oscillation FET 20, so long as the gate width of the impedance controlling FET 30 is designed at a suitable value.

In the present embodiment, capacitor C2 in the first embodiment need not be provided so that the circuit configuration can be simplified. In addition, bias resistor 18 may be also omitted to further simplify the circuit configuration.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A variable frequency microwave oscillator comprising a first function field effect transistor (JFET) having a gate, source and a drain, an impedance block connected to the source of said first JFET to determine a source impedance appearing on the source of said first JFET, and a variable bias block having a control terminal for receiving a control voltage and connected to the drain of said first JFET to determine a drain impedance appearing on the drain of said first JFET at a value based on said control voltage, whereby the gate of said first JFET exhibits in a certain frequency range a negative impedance for oscillation determined by said source impedance and drain impedance, wherein said variable bias block comprises an inductance having a first electrode connected to the drain of said first JFET and a second electrode, and a second JFET having a drain connected to the second electrode of said inductance.

2. A variable frequency microwave oscillator as defined in claim 1 wherein said second JFET has a source connected to the ground through a capacitor for cutting off a direct current component.

3. A variable frequency microwave oscillator as defined in claim 1 wherein said second JFET has a source connected to a power supply line.

4. A variable frequency microwave oscillator as defined in claim 1 further including a resonance frequency block connected to the gate of said first JFET for determining an oscillation frequency of said microwave oscillator in association with said negative impedance.

5. A variable frequency microwave oscillator as defined in claim 4 wherein said resonance frequency block comprises a dielectric resonator and a strip line for determining a resonance frequency of said resonance frequency block in association with said dielectric resonator.

6. A variable frequency microwave oscillator as defined in claim 1 wherein said certain frequency range is determined by said negative impedance and an on-impedance of said second JFET supplied with the control voltage which is substantially 0 volt.

* * * * *